United States Patent
Liu (10) Patent No.: US 9,618,583 B2
(45) Date of Patent: Apr. 11, 2017

(54) FAULT DETECTION IN INDUCTION MOTORS BASED ON CURRENT SIGNATURE ANALYSIS

(71) Applicant: Mitsubishi Electric Research Laboratories, Inc., Cambridge, MA (US)

(72) Inventor: Dehong Liu, Lexington, MA (US)

(73) Assignee: Mitsubishi Electric Research Laboratories, Inc, Cambridge, MA (US)

( * ) Notice: Subject to any disclaimer, the term of this patent is extended or adjusted under 35 U.S.C. 154(b) by 90 days.

(21) Appl. No.: 14/642,956

(22) Filed: Mar. 10, 2015

(65) Prior Publication Data

US 2016/0266207 A1    Sep. 15, 2016

(51) Int. Cl.
*G01R 31/06* (2006.01)
*G01R 31/34* (2006.01)
(Continued)

(52) U.S. Cl.
CPC ......... *G01R 31/346* (2013.01); *G01R 31/024* (2013.01); *H02H 3/08* (2013.01);
(Continued)

(58) Field of Classification Search
CPC .... G01R 31/06; G01R 31/346; G01R 31/024; G01R 31/343; G01R 5/08; G01R 5/16;
(Continued)

(56) References Cited

U.S. PATENT DOCUMENTS 3,582,735 A * 6/1971 Maruschak ............. H02P 25/03
                                                          318/718
4,377,784 A * 3/1983 Saito .................... G01R 31/346
                                                          318/490
(Continued)

FOREIGN PATENT DOCUMENTS

| EP | 2565658 A1 * | 3/2013 | ........... G01R 31/343 |
| GB | EP 2790028 A1 * | 10/2014 | ............ G01R 31/34 |
| WO | 2011006528 A1 | 1/2011 | |

OTHER PUBLICATIONS

Liu, D., Lu, D., Off-the-grid compressive sensing for broken-rotor-bar fault detection in squirrel-cage induction motors, 2015 IFAC Symposium on Fault Detection, Supervision and Safety for Technical Processes (SAFEPROCESS), Mitubishi Electric Research Laboratories, Inc. 2015.*

(Continued)

*Primary Examiner* — Hoai-An D Nguyen
*Assistant Examiner* — Sean Curtis
(74) *Attorney, Agent, or Firm* — Gene Vinokur; James McAleenan; Hironori Tsukamoto (57) ABSTRACT

A method detects faults during a steady state of an operation of an induction motor. The method measures, in a time domain, a signal of a current powering the induction motor with a fundamental frequency and determines, in a frequency domain, a set of frequencies with non-zero amplitudes, such that a reconstructed signal formed by the set of frequencies with non-zero amplitudes approximates the signal measured in the time domain. The determining includes a compressive sensing via searching within a subband including the fundamental frequency of the signal subject to condition of a sparsity of the signal in the frequency domain.

(Continued)

The method detects a fault in the induction motor if the set of frequencies includes a fault frequency different from the fundamental frequency.

14 Claims, 5 Drawing Sheets

(51) Int. Cl.
 H02H 3/08 (2006.01)
 H02H 3/46 (2006.01)
 H02H 3/52 (2006.01)
 H02H 7/08 (2006.01)
 H02H 7/085 (2006.01)
 G01R 31/02 (2006.01)

(52) U.S. Cl.
 CPC ............... *H02H 3/46* (2013.01); *H02H 3/52* (2013.01); *H02H 7/08* (2013.01); *H02H 7/0833* (2013.01); *H02H 7/0854* (2013.01)

(58) Field of Classification Search
 CPC .... G01R 5/18; G01R 33/445; G01R 33/4831; G01R 11/00; G01R 11/32; G01R 11/34; G01R 11/48; G01R 15/188
 USPC ........ 324/545, 765.01, 137, 154 R; 318/418, 318/432, 490; 702/38, 58, 66, 150–151
 See application file for complete search history.

(56) References Cited

U.S. PATENT DOCUMENTS

| | | | | |
|---|---|---|---|---|
| 4,761,703 A * | 8/1988 | Kliman | | H02H 7/08 318/798 |
| 4,808,932 A * | 2/1989 | Schulz, Jr. | | G01R 31/343 324/545 |
| 4,965,513 A * | 10/1990 | Haynes | | F16K 37/0083 318/490 |
| 4,978,909 A * | 12/1990 | Hendrix | | G01R 31/343 324/76.19 |
| 5,049,815 A * | 9/1991 | Kliman | | G01R 31/346 324/545 |
| 5,461,329 A * | 10/1995 | Linehan | | G01R 31/343 324/765.01 |
| 5,519,337 A * | 5/1996 | Casada | | G01R 31/343 324/545 |
| 5,521,482 A * | 5/1996 | Lang | | G01R 31/343 318/800 |
| 5,739,698 A * | 4/1998 | Bowers | | G01R 31/343 324/545 |
| 5,742,522 A * | 4/1998 | Yazici | | G05B 9/02 324/545 |
| 6,308,140 B1 * | 10/2001 | Dowling | | G01R 31/343 324/765.01 |
| 6,640,196 B1 * | 10/2003 | Unsworth | | G01R 31/343 702/115 |
| 6,789,028 B2 * | 9/2004 | Dragomir-Daescu | .... | G01P 3/48 702/66 |
| 6,933,693 B2 * | 8/2005 | Schuchmann | | F04D 15/0209 318/432 |
| 6,993,439 B2 * | 1/2006 | Grosjean | | G01M 15/04 324/76.12 |
| 7,075,327 B2 * | 7/2006 | Dimino | | G05B 23/0229 324/765.01 |
| 7,081,760 B2 * | 7/2006 | Mirafzal | | G01R 31/343 324/545 |
| 7,117,125 B2 * | 10/2006 | Dimino | | G05B 23/0229 702/185 |
| 7,231,319 B2 * | 6/2007 | Dimino | | G05B 23/0229 361/23 |
| 7,336,455 B2 * | 2/2008 | Dimino | | G05B 23/0229 324/765.01 |
| 7,346,475 B2 * | 3/2008 | Dimino | | G05B 23/0229 702/185 |
| 7,777,516 B2 * | 8/2010 | Zhou | | G01R 31/343 324/765.01 |
| 7,847,580 B2 * | 12/2010 | Zhou | | G01R 31/343 324/765.01 |
| 8,054,084 B2 * | 11/2011 | Schulz | | G01R 31/346 324/545 |
| 8,164,298 B2 * | 4/2012 | Anwar | | G01R 31/025 318/430 |
| 8,405,339 B2 * | 3/2013 | Zhang | | G01R 31/343 318/490 |
| 8,473,228 B2 * | 6/2013 | Tiwari | | H02P 29/0241 324/545 |
| 8,958,995 B2 * | 2/2015 | Kar | | G01K 13/08 702/36 |
| 8,994,359 B2 * | 3/2015 | Neti | | G01R 31/343 324/71.1 |
| 9,018,881 B2 * | 4/2015 | Mao | | H02P 29/0241 318/400.01 |
| 9,389,276 B2 * | 7/2016 | Nandi | | G01R 31/343 |
| 2004/0109267 A1 | 6/2004 | Habetler | | |
| 2010/0169030 A1 * | 7/2010 | Parlos | | G01H 1/00 702/58 |
| 2012/0001580 A1 * | 1/2012 | Zhang | | G01R 31/343 318/490 |
| 2013/0049733 A1 * | 2/2013 | Neti | | G01R 31/343 324/71.1 |
| 2013/0218484 A1 * | 8/2013 | Kar | | G01K 13/08 702/36 |
| 2013/0338939 A1 * | 12/2013 | Nandi | | G01R 31/346 702/38 |
| 2014/0074427 A1 * | 3/2014 | Ottewill | | G01R 31/343 702/151 |
| 2014/0167810 A1 * | 6/2014 | Neti | | G01R 31/34 324/765.01 |
| 2014/0172326 A1 * | 6/2014 | Zhang | | G01M 13/00 702/38 |
| 2014/0303913 A1 * | 10/2014 | Neti | | G01R 31/34 702/58 |
| 2015/0260794 A1 * | 9/2015 | Athikessavan | | G01R 31/343 702/58 |

OTHER PUBLICATIONS

Mazari, Rose., Compressive sensing algorithms applied to stator current signal,SICOM, Laboratory of Multimedia Signal and Systems, 2015.*
Hansen et al., Broken Rotor Bar Fault Detection in Induction Motors Using Starting Current Analysis, University of Adelaide, School of Electrical and Electronic Engineering, 2005.*
Siau et al., Broken Bar Detection in Induction Motors Using Current and Flux Spectral Analysis, 2004, University of Adelaide.*
Wolbank et al., Monitoring of Partially Broken Rotor Bars in Induction Machine Drives, Department of Electrical Drives and Machinees, Vienna University of Technology, IEEE 2010.*
Wang et al., A Two-Stage Compression Method for the Fault Detection of Roller Bearings, School of Mechanical and Electrical Engineering, Bejing University of Chemical Technology, Hindawi Publishing Corporation, 2016.*
Jaksch, Ivan., Rotor Cage Fault Detection in Induction Motors by Motor Current Demodulation Analysis, 2012 Jaksch, Intech.*
Tang et al., Compressed Sensing Off the Grid, Department of Electrical and Computer Engineering, University of Wisconsin—Madison, 2013.*
Thomson et al., Industrial Application of Current Signature Analysis to Diagnose Faults in 3-phase Squirrel Cage Induction Motors, 2000, IEEE.*
Zouzou et al., Detection of Inter-Turn Short-Circuit and Broken Rotor Bars in Induction Motoros Using the Partial Relative Indexes: Application on the MCSA, 2010 International Conference on Electrical Machines.*
Zarei et al., Broken rotor bars detection via Park's vector approach based on ANFIS, 2014 IEEE.*

(56) References Cited

OTHER PUBLICATIONS da Silva, Aderiano, Induction Motor Fault Diagnostic and Monitoring Methods, Marquette University, 2006.*

Kala et al., Design of Compressed Sensing systesms for wireless sensor under the performance and reliability constraints, International Journal of Innovative Research in Computer and Communication Engineering, vol. 2, Speciall Issue 1, Mar. 2014.*

Duarte et al. "Spectral Compressive Sensing," Applied and Computational Harmonic Analysis., vol. 35, No. 1, Jul. 1, 2013.

* cited by examiner

FAULT DETECTION IN INDUCTION MOTORS BASED ON CURRENT SIGNATURE ANALYSIS

FIELD OF THE INVENTION

The present invention relates, generally, to the field of monitoring electric machines, and, more particularly, to fault detection in induction motors based on current signature analysis.

BACKGROUND OF THE INVENTION

Induction motors are widely used in a variety of application areas such as power generation systems, manufacturing units, factories, electronic appliances, and the like. Induction motors can experience a variety of faults such as drive-train failure, bearing faults, broken rotor bars faults. For example, broken rotor bars faults can cause the broken parts to hit stator windings at high velocity resulting in failures of the inductive motors. Therefore, there is a need to detect a fault in the induction motors to reduce the losses caused by such faults.

Different techniques for fault detection that are employed at present include, but are not limited to, vibration and acoustic noise analysis, electromagnetic field monitoring and axial flow measurement, temperature measurement, infrared recognition, and spectral analysis of stator current in the motor.

Conventionally, the monitoring of faults in induction motors has been mainly performed using vibration signals. The mechanical faults in rotor bars produce vibrations in radial rotor movement which in turn produce torque oscillations at the rotor mechanical rotating frequency. The monitoring and study of the rotor mechanical rotating frequency can lead to detecting mechanical faults associated with the rotor bars. However, condition monitoring using vibration signals has numerous disadvantages such as background noise due to external excitation motion, and sensitivity to the installation position.

Another technique of the fault detection methods is based on the analysis of the stator current. Such a technique is receiving increased attention in the detection of mechanical faults in electric machines due to offering significant economic savings and simple implementation, see, e.g., U.S. 2014/0303913. However, certain fault current signatures, such as ones observed for broken bar faults, are usually subtle compared to the dominant components in the sampled stator current such as a fundamental frequency of the power supply, eccentricity harmonics, and slot harmonics. Unlike vibration monitoring, for which industry standards have been developed from long-time field experience, the field experience in stator current monitoring is limited, and significant difficulties exist.

For example, the magnitude of fault signatures can vary at different loads even if the fault signatures in the stator current are already subtle. In addition, with broken bar fault detection, the signature frequency of broken bar fault in the stator current is close to the fundamental frequency of the induction motor. As a result, it can be difficult to distinguish fault signatures from the normal operation signatures, when rotor bars of the induction motor are faulty.

Therefore, there exists a need for a method and a system for detecting faults of in the induction motors based on current signature analysis.

SUMMARY OF THE INVENTION

It is an object of some embodiments of an invention to provide a system and a method suitable for performing a fault detection of an induction motor based on analysis of the stator current powering the induction motor during the steady state of the operation of the induction motor. In such a manner, the fault detection can be performed continuously and concurrently with the operation of the induction motor, and without a need for restarting the induction motor.

It is another object of some embodiments to provide such a system and a method that can perform the fault detection within a brief period of time during the steady state sufficient to assume a constant speed of a rotor of the induction motor that is affected by a load and conditions of the operation of the induction motor.

Some embodiments of the invention are based on recognitions that under fault conditions the resulting stator current powering the induction motor is sparse in a frequency domain. This is because the stator current includes harmonics of a fundamental frequency of a power supply generating the stator current and fault frequency components caused by the fault. The spectral magnitudes of the fault frequency components are generally small. In addition, the fault frequency component with the highest magnitude has fault characteristic frequency that is close to the fundamental frequency, e.g., within 5% of the fundamental frequency.

These recognitions lead to a realization that the combination of the sparsity of the signal and limited range of possible values of the signal enable reconstruction of the actual signal using various compressive sensing techniques.

Usually, the compressive sensing techniques are used to recover a signal sampled at a sampling rate below its Nyquist sampling rate, which is twice the highest frequency of the signal. However, one embodiment uses the compressive sensing techniques in an opposite manner by preserving the sampling rate to be Nyquist rate and reducing the period of time for measuring the signal. This embodiment can achieve high resolution recovery within a brief period of time, e.g., less than 1 second, enabling the fault detection analysis during the steady state of the operation of the induction motor.

Accordingly, one embodiment of the invention discloses a method for detecting faults during a steady state of an operation of an induction motor. The method includes measuring, in a time domain, a signal of a current powering the induction motor with a fundamental frequency; determining, in a frequency domain, a set of frequencies with non-zero amplitudes, such that a reconstructed signal formed by the set of frequencies with non-zero amplitudes approximates the signal measured in the time domain, wherein the determining includes a compressive sensing via searching within a subband including the fundamental frequency of the signal subject to condition of a sparsity of the signal in the frequency domain; and detecting a fault in the induction motor if the set of frequencies includes a fault frequency different from the fundamental frequency. The steps of the method are performed by a processor.

Another embodiment discloses a system for operating an induction motor having a stator and rotor bars including a power supply for powering the stator of the induction motor with a stator current having a fundamental frequency; a sensor for measuring, in a time domain, a signal of a stator current powering the induction motor, wherein the measuring includes sampling the signal for a period of time during a steady state of the operation of the induction motor with a sampling rate of at least twice of a fundamental frequency of the stator current; a processor for determining, in a frequency domain, a set of frequencies with non-zero amplitudes, such that a reconstructed signal formed by the frequencies with corresponding amplitudes approximates the signal measured in the time domain, wherein the determining includes searching within a subband including the fundamental frequency subject to condition of a sparsity of the signal in the frequency domain, and; a user interface for signaling the fault, if the set of frequencies includes a fault frequency approaching the dominant frequency.

DETAILED DESCRIPTION OF THE PREFERRED EMBODIMENTS

Figure 1:
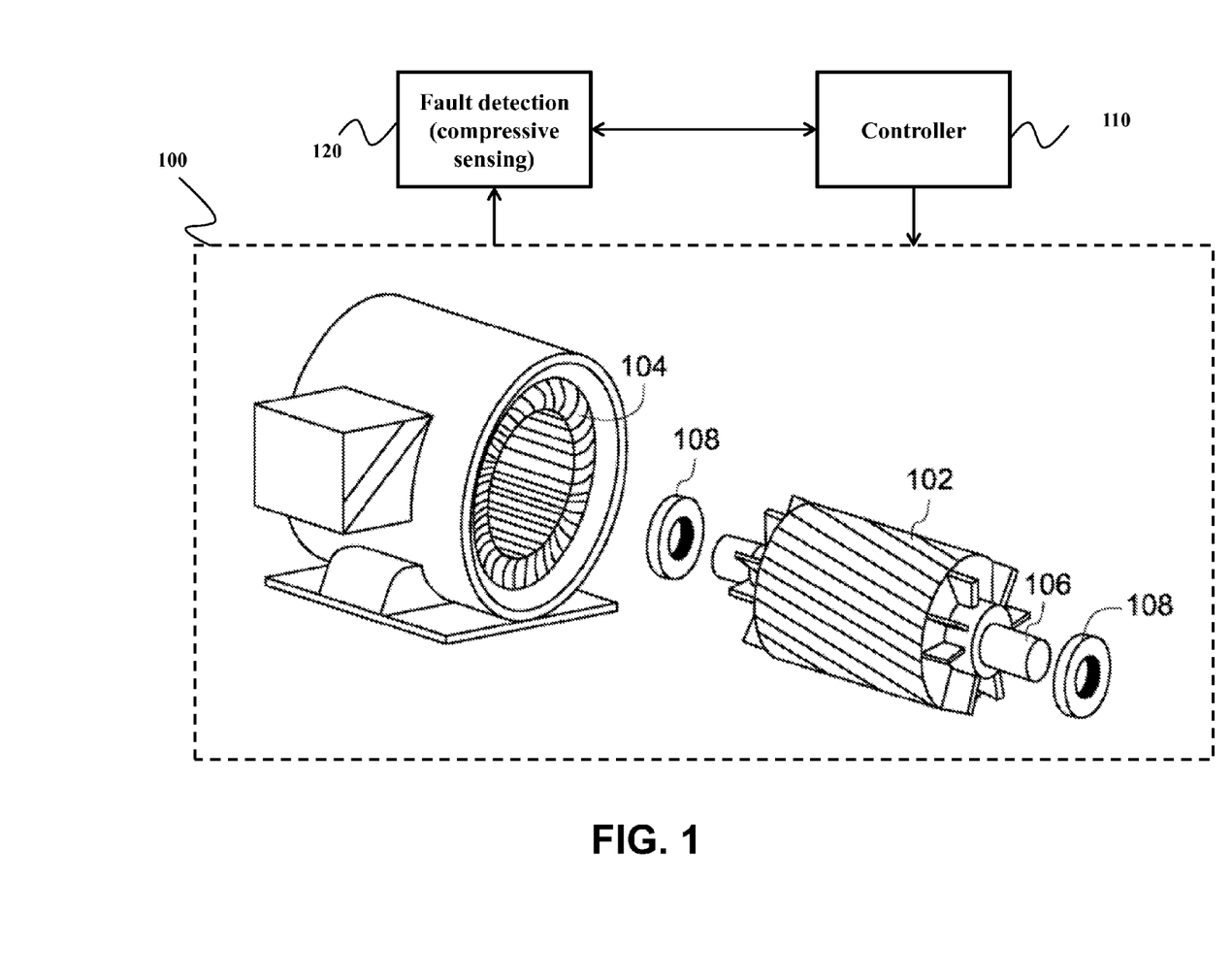
FIG. 1 is a schematic of a system for controlling an induction motor according to one embodiment of an invention.

FIG. 1 is a schematic of a system for controlling an exemplar induction motor according to one embodiment of an invention. The induction motor 100 includes a rotor assembly 102, a stator assembly 104, a main shaft 106, and a main bearing 108. In this example, the induction motor 100 is a squirrel-cage induction motor. A broken rotor bar of the assembly 102 is a typical fault for such an induction motor.

The controller 110 can be used for monitoring and controlling the operation of the induction motor 100 in response to various inputs in accordance with embodiments of the present invention. For example, a controller coupled with the induction motor 100 can control operations of the induction motor based on inputs received from sensors configured to acquire data pertaining to operating conditions of the induction motor 100. According to certain embodiments, the electrical signal sensors can be current and voltage sensors for acquiring current and voltage data pertaining to the induction motor 100. For example, the current sensor senses current data from one or more of the multiple phases of the induction motor. More specifically, in the case of the induction motor is a 3-phase induction motor, the current and voltage sensors sense the current and voltage data from the three phases of the 3-phase induction motor. While certain embodiments of the present invention will be described with respect to a multi-phase induction motors, other embodiments of the present invention can be applied to other multi-phase electromechanical machines.

Some embodiments of the present invention describe a system for detection of broken bar faults in an electromechanical machine, such as the induction motor 100. The controller configured for detection includes a fault-detection module 120 for detecting the presence of a faulty condition of various components, including rotor bars, within the induction motor assembly. In one embodiment, the fault detection module 120 is implemented as a sub-system of the controller 110. In alternative embodiment, the fault-detection module 120 is implemented using a separate processor. The fault-detection module 120 is operatively connected to the controller 110. In some implementations the fault-detection module 120 and the controller 110 can share the information. For example, the fault detection module can reused sensor data used by the controller to control the operation of the induction motor.

The presence of the broken bar in the induction motor 100 leads to reduction in the torque of the rotor thus leading to increasing reliance on other rotor bars of the induction motor 100 to provide the desired current. The increased dependence on other rotor bars leads to an increase in the rate of deterioration of the other rotor bars and thus leads to an overall effect on the performance of the induction motor.

In one embodiment of the invention, the current and voltage sensors respectively detect stator current data from the stator assembly 104 of the induction motor 100. The current data and voltage data acquired from the sensors is communicated to the controller and/or the fault detection module for further processing and analysis. The analysis includes performing current signature analysis (CSA) to detect faults within the induction motor 100 using a compressive sensing. In some embodiments, upon detecting the fault, the controller 110 interrupts the operation of the induction motor for further inspection or repair.

Figure 2A:
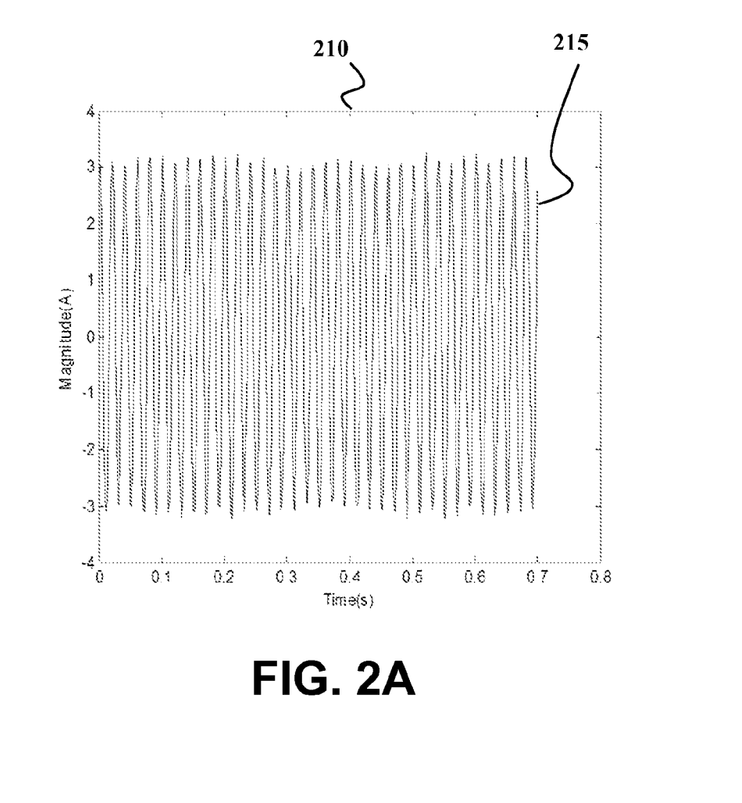
FIGS. 2A and 2B are exemplar plots of a signal of a stator current powering the induction motor in a time and a frequency domain in the presence of the fault.
Figure 2B:
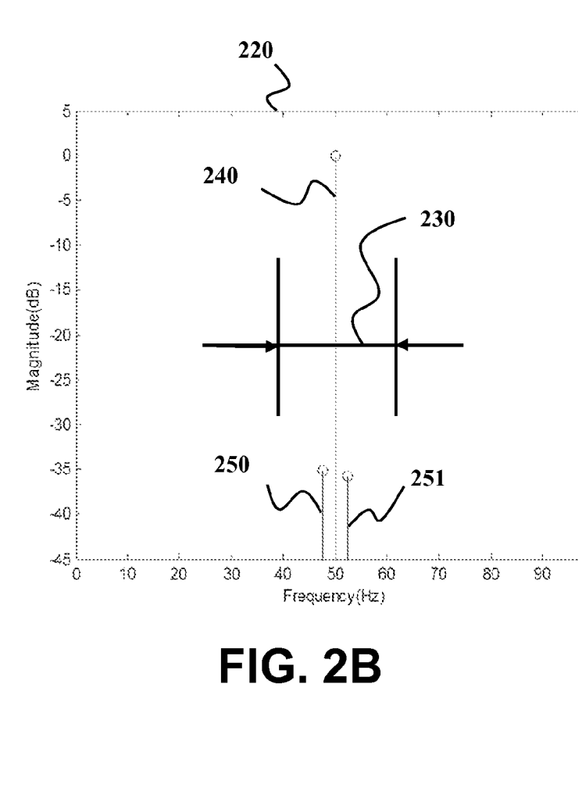

FIG. 2A shows an exemplar plot 210 in a time domain of a signal 215 of a stator current powering the induction motor. FIG. 2B shows the plot 220 of the signal in the frequency domain in the presence of the fault. When there exists a fault in the induction motor, the rotor operates asymmetrically, inducing a fundamental frequency component 240 and extra fault frequency components 250, 251 $f_{sb}=(1\pm 2\,ks)f_s$ in the stator current, where s is the speed slip; $f_s$ is the fundamental frequency of the power supply, and k=1, 2, 3 . . . is the harmonic frequency index.

Compared to fundamental frequency component 240, the magnitudes of the fault frequency components 250 or 251 are generally very small, in which the $(1-2\,s)f_s$ component is the strongest one and can be treated as the indicator of the fault. The frequency $(1-2\,s)f_s$ is referred herein as characteristic frequency of the fault component. Some embodiments of the invention determine the fault in the induction motor via motor current signature analysis (MCSA) by detecting the characteristic frequency component $(1-2\,s)f_s$.

However, it is challenging to detect the characteristic component due to the following factors. First, the magnitude of characteristic frequency is relatively small, typical 30~40 dB lower than that of the fundamental power supply frequency. Second, the characteristic frequency $(1-2\,s)f_s$ is close the power supply frequency $f_s$, i.e., the fundamental frequency 240 and the fault frequency 250 or 251 are within a subband or a range 230. For example, under steady operating condition, the rotor speed slip s typically ranges from 0.005 to 0.05, so the frequency difference between the characteristic frequency and the fundamental frequency $f_s$ can be as small as 0.01 $f_s$ making difficult to distinguish the characteristic frequency from the fundamental frequency.

In such situations, the extension of the sampling time, e.g., 10-15 sec, can help to increase the resolution of signal reconstruction. However, such an extension requires near constant load to ensure that motor current remain stable during the whole measurement period. This constant load requirement in many cases can be troublesome because the unavoidable load fluctuation in reality especially over a long measurement period.

Some embodiments of the invention are based on a realization that the combination of the sparsity of the signal and limited range of possible values of the signal enable reconstruction of the actual signal using various compressive sensing techniques. Therefore, some embodiments use a high frequency resolution analysis with very short time of measurements, e.g., less than 1 sec, using compressive sensing.

Figure 3:
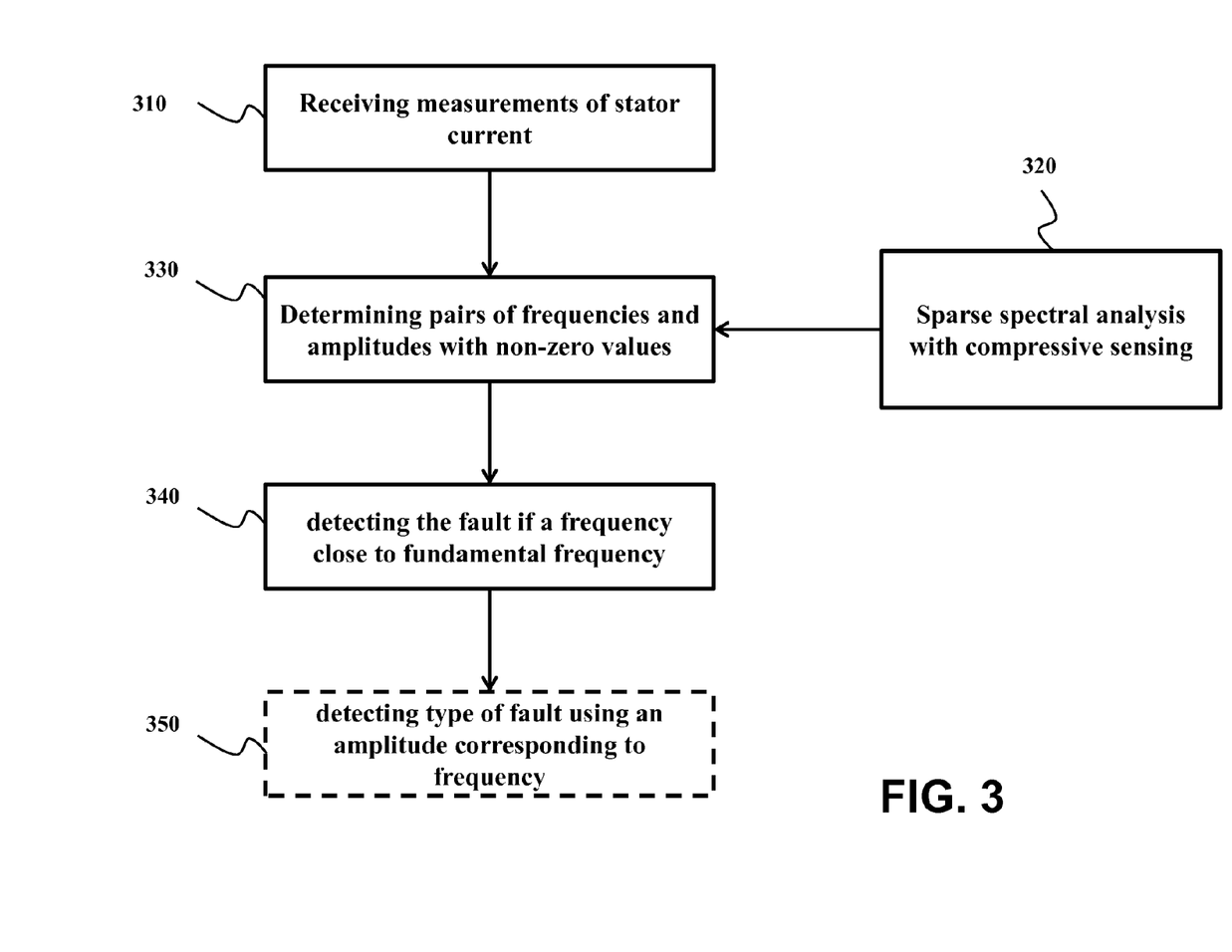
FIG. 3 is a block diagram of a method for detection of rotor bar faults in the induction motor according to one embodiment of the invention.

FIG. 3 shows a block diagram of a method for detecting faults during a steady state of an operation of an induction motor according to one embodiment of the invention. The embodiment uses 310 measurements of a signal of a stator current powering the induction motor measured in a time domain to determine 330, in a frequency domain, a set frequencies 240, 250, 251 of the signal with non-zero amplitudes, such that a reconstructed signal formed by the set of pairs of frequencies and amplitudes approximates the signal measured in the time domain. The embodiment determines the set of pairs of frequencies and amplitudes using compressive sensing 320 by searching within a subband including a fundamental frequency of the signal subject to condition of a sparsity of the signal in the frequency domain.

The embodiment detects 340 a fault in the induction motor if the set of frequencies with non-zero amplitudes includes a frequency 250 different from the fundamental frequency 240. This frequency is the fault frequency. In some implementations, the embodiments can also optionally determine 350 a type of the fault based on an amplitude of the pair. For example, the type of the fault is the partial broken bar if the amplitude of the pair is less than a first threshold, and otherwise, the type of the fault is fully broken bar. Additionally or alternatively, the embodiment can detect multiple broken bars be determining multiple fault frequency components, e.g., 250 and 251.

For example, according to some embodiments, the magnitude of fault frequency under one-broken bar condition is about $20 \log_{10}(n)$ dB below the magnitude of the fundamental frequency, where n is the number of rotor bars. For partial broken bar, the magnitude of fault frequency is even lower, about 5~10 dB lower than that of one full-broken bar fault.

Figure 4:
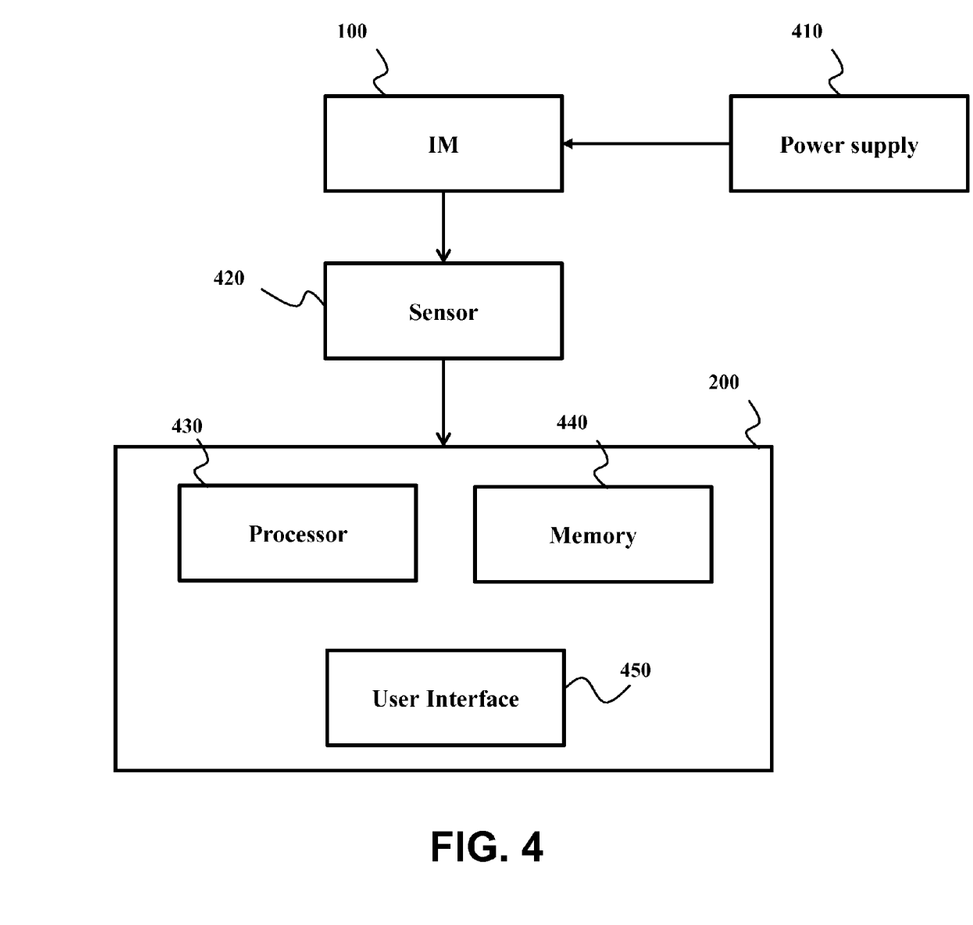
FIG. 4 is a block diagram of a system for detecting the faults in the induction motor according to one embodiment of the invention.

FIG. 4 shows a system for operating an induction motor having a stator and rotor bars. The system includes a power supply 410 for powering the stator of the induction motor with a stator current having a fundamental frequency. The system also includes a sensor for measuring, in a time domain, a signal of a stator current powering the induction motor. The measuring includes sampling the signal for a period of time during a steady state of the operation of the induction motor with a sampling rate of at least twice of a fundamental frequency of the stator current.

A processor 430 determines, in a frequency domain, a set of frequencies with non-zero amplitudes, such that a reconstructed signal formed by the frequencies with non-zero amplitudes approximates the signal measured in the time domain. The determining includes searching within a subband including the fundamental frequency subject to condition of a sparsity of the signal in the frequency domain.

The system also includes a memory for storing the measurements of the signal and various parameters and coefficients for performing compressive sensing analysis. The system can also include a user interface for signaling the fault, if the set of frequencies with non-zero amplitudes includes a frequency different from the dominant frequency.

The compressive sensing is a method to capture and represent sparse or compressible signals at a rate well below its Nyquist sampling rate. This sampling rate reduction is achieved by measuring uncorrelated or randomized projections of the sparse signals and reconstructing the sparse signal using improved signal models and non-linear reconstruction algorithms. The sampling rate reduction can be interpreted as high resolution. For example, in spectral analysis with a fewer amount of measurements, the compressive sensing can help to reconstruct the same high resolution frequency spectrum. Furthermore, compressive sensing with the same amount of measurements can achieve higher resolution than the direct signal reconstruction.

The motor current spectrum with fault characteristic frequency exhibits sparse characteristics in the frequency domain. Therefore, the characteristic frequency component can be resolved with high resolution using compressive sensing based techniques. Accordingly, some embodiments determine a set of frequencies with non-zero amplitudes using a compressive sensing, such that a reconstructed signal formed by the set of frequencies with non-zero amplitudes approximates the signal measured in the time domain. The determining with the compressive sensing includes searching within a subband including the fundamental frequency of the signal subject to condition of a sparsity of the signal in the frequency domain. For example, the searching for the set of frequencies with non-zero amplitudes can be performed using a gradient search with atomic norm constraints representing a sparsity of the signal.

For example, the signal under observation x can be represented by a sparse coefficient vector a with basis A as $x=A\alpha$. Measurements are made on the signal x through a projection matrix $\Phi$ as follows $$y=\Phi x=\Phi A\alpha=\Sigma\alpha, \quad (1)$$

wherein y represents measurement, and $\Sigma=\Phi A$ is the overall sensing matrix.

According to the principles of the compressive sensing, if $\Sigma$ satisfies the restricted isometry property, a can be reconstructed with overwhelming probability by solving, e.g., an $L_1$-minimization problem according to $$\min \|\alpha\|_1 \text{ s.t. } y=\Sigma\alpha. \quad (2)$$

The characteristic frequency is distributed in the continuous frequency domain. However, one embodiment uses a discretization sampling to reduce the continuous parameter space to a finite set of grid points. This embodiment can reconstruct the signal where the set of lies on the grid corresponding to the discretized measurements. However, in cases where the correct frequencies do not fall into the finite grid, the signal cannot be sparsely represented by the discrete basis. Accordingly, some embodiments use high-resolution off-the-grid compressive sensing by generalizing the discrete basis to a continuous basis.

Figure 5:
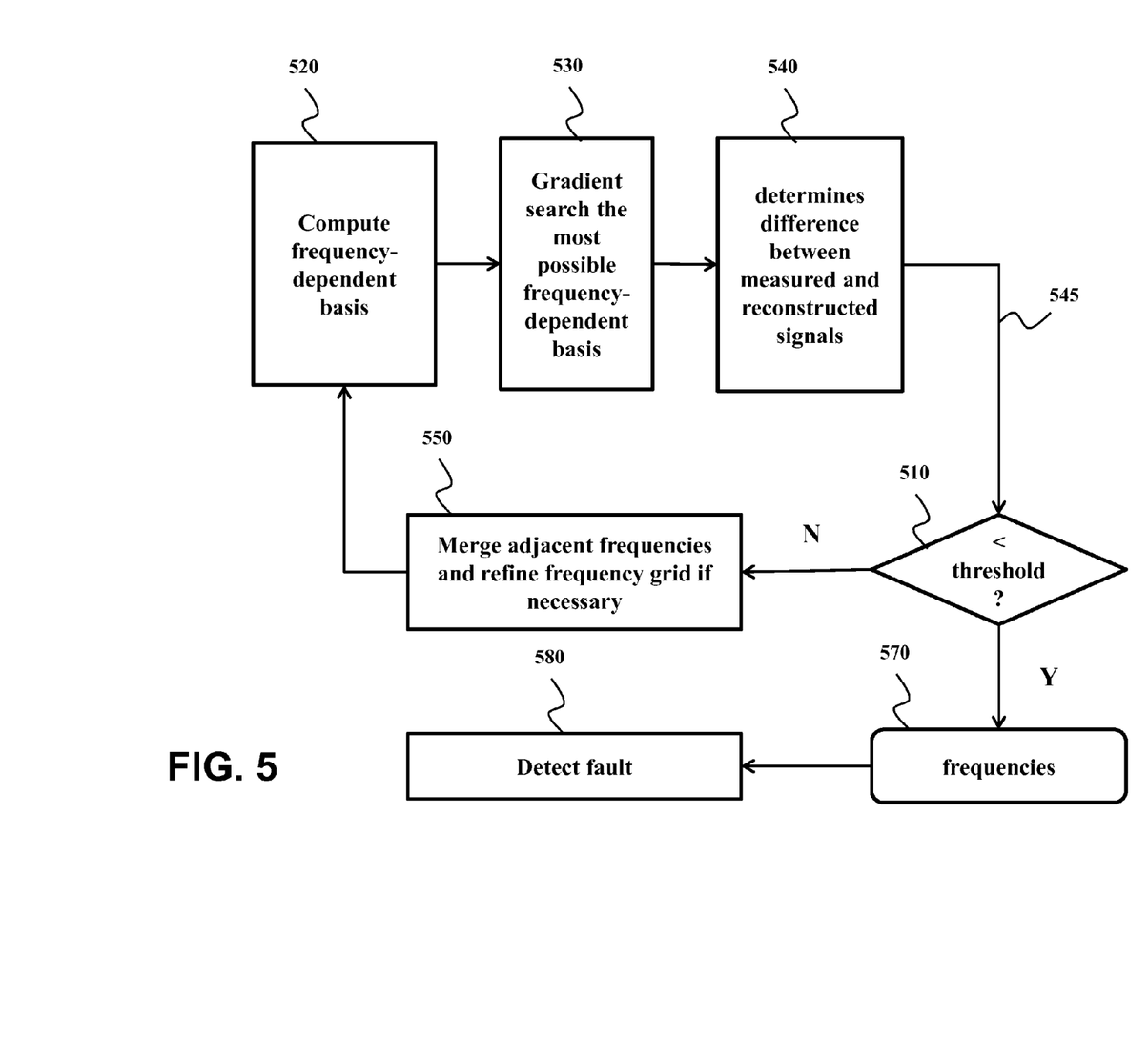
FIG. 5 is a block diagram of a method for detecting the faults in the induction motor according to another embodiment of the invention.

FIG. 5 is a block diagram of a method for detecting the faults in the induction motor using the off-the-grid compressive sensing according to another embodiment of the invention. The embodiment samples the signal with a sampling rate of at least twice of the fundamental frequency of the signal. The sampling is performed on a uniform grid to produce a set of samples for a grid of frequencies. The embodiment uses the high resolution off-the-grid compressive sensing including searching for a frequency between adjacent samples on the grid of frequencies.

The embodiment determines or initializes 520 basis of refined frequency grids, i.e., frequencies with non-zero amplitude, within the neighborhood area of fundamental frequency and coarse frequency grids outside the neighborhood area and initializes the sparse coefficient of the fundamental frequency. Next, the embodiment uses 530 the gradient search to find the most possible basis which can sparsely present the measured signal, i.e., the frequencies with non-zero amplitudes approximates the signal measured in the time domain.

The embodiment determines 540 a difference 545 between the measured and the reconstructed signals and compares 510 the difference 545 with a threshold. The embodiment outputs 570 the frequencies, if the difference between measured and reconstructed signals is less than a threshold. Otherwise, the embodiment updates 550 the basis and its corresponding sparse coefficients, merge closely adjacent frequencies, refines frequency grid if necessary and repeat the search by treating the difference as measured signal.

The embodiment detects 580 the fault, if there exists fault frequency component with magnitude greater than a certain value, for example, −30 dB of the fundamental frequency component, and the fault frequency is close to the fundamental frequency, for example, within 5% of the fundamental frequency. Than greater the magnitude of the fault frequency then the more likely there is a, e.g., broken-bar fault.

For example, time-domain stator current x(t) is a continuous signal of the form $$x(t) = \sum_{k=1}^{s} c_k e^{i2\pi w_k t}, \quad (3)$$

where the frequencies $\{w_k\}$ lie in $[-W, W]$, $c_k$ is the magnitude at frequency $w_k$. By taking regularly spaced Nyquist samples at $t \in \{0, \tfrac{1}{2}W, \ldots, (n-1)/2W\}$, the embodiment determines discrete time-domain samples $$x_j = \sum_{k=1}^{s} c_k e^{i2\pi \frac{w_k}{2W} j} = \sum_{k=1}^{s} c_k e^{i2\pi f_k j}, \quad (4)$$

with $$f_k = \frac{w_k}{2W} \in \left[-\frac{1}{2}, \frac{1}{2}\right].$$

In one implementation, the signal reconstruction includes solving an atomic-norm minimization problem $$\min_x \frac{1}{2}\|y - \Phi x\|_2^2 \;\; \text{s.t.} \;\; \|x\|_A \leq \tau_y, \quad (5)$$

where y corresponds to observed noisy measurements and the atomic norm $\|x\|_A$ is defined as $$\|x\|_A := \inf\left\{\sum_{a \in A} c_a : x = \sum_{a \in A} c_a a, c_a \geq 0\right\}. \quad (6)$$

where $A=\{a\}$ is the set of atoms, and $c_a$ is the weight of atom a. With the high-resolution off-the-grid compressive sensing method, some embodiments perform fault detection by extracting sparse characteristic frequency component in the stator current signal with improved performance. These embodiments minimize a least-square loss function that measures the difference between the signal representation and the observations, subject to a constraint in terms of an atomic norm as in (6). Some embodiments predefine the atoms for fast reconstruction. For example, the stator current includes fundamental power supply frequency and possible fault characteristic frequency which is close to the power supply frequency. Therefore, some embodiments refine frequency grid in the area centered the fundamental frequency within, e.g., 5 Hz, while only consider coarse grid elsewhere.

The above-described embodiments of the present invention can be implemented in any of numerous ways. For example, the embodiments can be implemented using hardware, software or a combination thereof. When implemented in software, the software code can be executed on any suitable processor or collection of processors, whether provided in a single computer or distributed among multiple computers, for example, in a computer cloud. Such processors can be implemented as integrated circuits, with one or more processors in an integrated circuit component. Though, a processor can be implemented using circuitry in any suitable format.

Further, it should be appreciated that a computer can be embodied in any of a number of forms, such as a rack-mounted computer, a desktop computer, a laptop computer, minicomputer, or a tablet computer. Such computers can be interconnected by one or more networks in any suitable form, including as a local area network or a wide area network, such as an enterprise network or the Internet. Such networks can be based on any suitable technology and can operate according to any suitable protocol and can include, for example, wireless networks, wired networks or fiber optic networks.

Also, the embodiments of the invention can be embodied as a method, of which an example has been provided. The steps performed as part of the method can be ordered in any suitable way. Accordingly, embodiments can be constructed in which acts are performed in an order different than illustrated, which can include performing some acts simultaneously, even though shown as sequential acts in illustrative embodiments.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

The invention claimed is:

1. A method for detecting faults during a steady state of an operation of an induction motor, comprising: measuring, in a time domain, a signal of a current powering the induction motor with a fundamental frequency; determining, in a frequency domain, a set of frequencies with non-zero amplitudes, such that a reconstructed signal formed by the set of frequencies with non-zero amplitudes approximates the signal measured in the time domain, wherein the determining includes a compressive sensing via searching within a subband including the fundamental frequency of the signal subject to condition of a sparsity of the signal in the frequency domain; detecting a fault in the induction motor if the set of frequencies includes a fault frequency different from the fundamental frequency; and determining a type of the fault based on an amplitude of the fault frequency, wherein the type includes one or combination of a partial broken bar and a number of broken bars, wherein the type of the fault is the partial broken bar if the amplitude of the fault frequency is less than a threshold, wherein steps of the method are performed by a processor.

2. The method of claim 1, further comprising: controlling a supply of the current to the induction motor based on an outcome of detecting the fault.

3. The method of claim 1, further comprising: interrupting supplying the current in response to detecting the fault.

4. The method of claim 1, wherein the compressive sensing comprises: searching for the set of frequencies with non-zero amplitudes using a gradient search with atomic norm constraints representing the sparsity of the signal.

5. The method of claim 1, wherein the reconstructed signal is determined based on measuring the signal for a period of time less than one second.

6. The method of claim 1, further comprising: determining a set of thresholds, each threshold in the set corresponds to a value of the number of broken bars; and comparing the amplitude of the pair fault frequency with the set of thresholds to determine the number of the broken bars.

7. The method of claim 1, wherein the measuring includes sampling the signal with a sampling rate of at least twice of the fundamental frequency of the signal, wherein the sampling is performed on a uniform grid to produce a set of samples for a grid of frequencies, and wherein the compressive sensing includes a high resolution off-the-grid compressive sensing including a searching for a frequency between adjacent samples on the grid of frequencies.

8. A system for operating an induction motor having a stator and rotor bars, comprising: a power supply for powering the stator of the induction motor with a stator current having a fundamental frequency; a sensor for measuring, in a time domain, a signal of a stator current powering the induction motor, wherein the measuring includes sampling the signal for a period of time during a steady state of the operation of the induction motor with a sampling rate of at least twice of a fundamental frequency of the stator current; a processor for determining, in a frequency domain, a set of frequencies with non-zero amplitudes, such that a reconstructed signal formed by the frequencies with corresponding amplitudes approximates the signal measured in the time domain, wherein the determining includes searching within a subband including the fundamental frequency subject to condition of a sparsity of the signal in the frequency domain; and a user interface for signaling the fault, if the set of frequencies includes a fault frequency approaching a dominant frequency, wherein the processor determines a type of the fault base amplitude of the fault frequency, wherein the type includes one or combination of a partial broken bar and a number of broken bars, wherein the type of the fault is the partial broken bar if the amplitude of the fault frequency is less than a threshold.

9. The system of claim 8, wherein the sensor samples the signal on a uniform grid with a sampling rate of at least twice of the fundamental frequency of the signal to produce a set of samples for a grid of frequencies, and wherein a compressive sensing includes a high resolution off-the-grid compressive sensing including a searching for a frequency between adjacent samples on the grid of frequencies.

10. The system of claim 8, wherein the compressive sensing uses a gradient search with atomic norm constraints representing the sparsity of the signal.

11. The system of claim 8, wherein the processor compares comparing the amplitude of the fault frequency with a threshold to determine a type of the fault, and wherein the user interface renders the type.

12. The system of claim 8, wherein the reconstructed signal is determined based on measuring the signal for a period of time less than one second.

13. The system of claim 8, wherein the processor commands the power supply to interrupt supplying the current in response to detecting the fault.

14. A method for detecting faults during a steady state of an operation of an induction motor, comprising: measuring, in a time domain, a signal of a current powering the induction motor with a fundamental frequency; determining, in a frequency domain, a set of frequencies with non-zero amplitudes, such that a reconstructed signal formed by the set of frequencies with non-zero amplitudes approximates the signal measured in the time domain, wherein the determining includes a compressive sensing via searching within a subband including the fundamental frequency of the signal subject to condition of a sparsity of the signal in the frequency domain; detecting a fault in the induction motor if the set of frequencies includes a fault frequency different from the fundamental frequency; determining a type of the fault based on an amplitude of the pair, wherein the type includes one or combination of a partial broken bar and a number of broken bars; determining a set of thresholds, each threshold in the set corresponds to a value of the number of broken bars; and comparing the amplitude of the fault frequency with the set of thresholds to determine the number of the broken bars, wherein steps of the method are performed by a processor.

\* \* \* \* \*